US012796174B2

(12) United States Patent
Wunderer

(10) Patent No.: US 12,796,174 B2
(45) Date of Patent: Nov. 10, 2026

(54) STRUCTURED EPITAXY FOR LIGHT EMITTING DIODE ARRAY

(71) Applicant: Genesee Valley Innovations, LLC, Santa Clara, CA (US)

(72) Inventor: Thomas Wunderer, Santa Cruz, CA (US)

(73) Assignee: Genesee Valley Innovations, LLC, Santa Clara, CA (US)

(*) Notice: Subject to any disclaimer, the term of this patent is extended or adjusted under 35 U.S.C. 154(b) by 910 days.

(21) Appl. No.: 17/977,025

(22) Filed: Oct. 31, 2022

(65) Prior Publication Data

US 2024/0145629 A1 May 2, 2024

(51) Int. Cl.
*H10H 20/82* (2025.01)
*H10H 20/811* (2025.01)

(52) U.S. Cl.
CPC .......... *H10H 20/82* (2025.01); *H10H 20/811* (2025.01)

(58) Field of Classification Search
CPC .................................................... H10H 20/013
See application file for complete search history.

(56) References Cited

U.S. PATENT DOCUMENTS 8,685,774 B2 4/2014 Crowder et al.
9,905,727 B2 2/2018 Wunderer
2012/0043525 A1* 2/2012 Pan ...................... H10H 20/821 257/E33.007
2023/0130445 A1* 4/2023 Tan .................... H10H 20/0137 257/13

OTHER PUBLICATIONS

Iida et al., "633-nm InGaN-based red LEDs grown on thick underlying GaN layers with reduced in-plane residual stress," 2020, *Appl. Phys. Lett*, 116: 162101-1-5.
Wunderer et al., "Three-dimensional GaN for semipolar light emitters," Oct. 27, 2010, *Phys. Status Solidi B*, pp. 1-12.
Zhuang et al., "630-nm red InGaN micro-light-emitting diodes (<20 μm × 20 μm) exceeding 1 mW/mm$^2$ for full-color micro-displays," Sep. 2021, *Photonics Research*, 9(9): 1796-1802.

* cited by examiner

*Primary Examiner* — Leonard Chang
*Assistant Examiner* — Hajar Kolahdouzan
(74) *Attorney, Agent, or Firm* — Mueting Raasch Group

(57) ABSTRACT

A light emitting diode array includes a growth mask having an array of closed shapes on a III-N layer. An array of group III-N inverted pyramids are epitaxially grown around the growth mask. The inverted pyramids include {10-11} or {11-22} facets and hexagonal bases. An array of III-N c-plane surfaces are parallel with the substrate and join the {10-11} or {11-22} facets of adjacent ones of the III-N inverted pyramids. A quantum well layer of a III-N compound is formed on the {10-11} or {11-22} facets and the c-plane surfaces. The quantum well layer has a first thickness on the {10-11} or {11-22} facets that forms first light emitting elements. The quantum well layer has a second thickness on the c-plane surfaces that forms second light emitting elements. The second light emitting elements emit light at a longer wavelength than the first light emitting elements.

16 Claims, 6 Drawing Sheets

STRUCTURED EPITAXY FOR LIGHT EMITTING DIODE ARRAY

SUMMARY

The present disclosure is directed to a structured epitaxy for a light emitting diode array, e.g., one usable in a micro light emitting diode display. In one embodiment, a light emitting diode array includes a growth mask with an array of closed shapes on a III-N layer. The III-N layer is epitaxially grown on a substrate. An array of group III-N inverted pyramids is epitaxially grown around the growth mask. The inverted pyramids have {10-11} or {11-22} facets and hexagonal bases. An array of III-N c-plane surfaces are parallel with the substrate joining the {10-11} or {11-22} facets of adjacent ones of the III-N inverted pyramids. One or more quantum well layers include a III-N compound formed on the {10-11} or {11-22} facets and the c-plane surfaces. The quantum well layer has a first thickness on the {10-11} or {11-22} facets forming first light emitting elements. The quantum well layer has a second thickness on the c-plane surfaces forming second light emitting elements. The second thickness is greater than the first thickness such that the second light emitting elements emit light at a longer wavelength than the first light emitting elements. A pattern of electrical contacts is disposed over the light emitting array and is operable to separately activate the first light emitting elements and the second light emitting elements.

In another embodiment, a method involves epitaxially forming a III-N base layer on a growth template or substrate and patterning an array of closed shapes of a mask material on a top plane of the III-N base layer. The method involves selective epitaxial growing of III-N structures around the array of closed shapes and extending above the closed shapes to form a first array of III-N inverted pyramids and a second array of III-N c-plane surfaces. The inverted pyramids include {10-11} or {11-22} facets and hexagonal bases. The III-N c-plane surfaces are parallel with the III-N base layer and join the {10-11} or {11-22} facets of adjacent ones of the III-N inverted pyramids. The method further involves epitaxially growing a quantum well layer comprising a III-N compound on the {10-11} or {11-22} facets and the c-plane surfaces. The quantum well layer has a first thickness on the {10-11} or {11-22} facets forming first light emitting elements. The quantum well layer has a second thickness on the c-plane surfaces forming second light emitting elements. The second thickness is greater than the first thickness such that the second light emitting elements emit light at a longer wavelength than the first light emitting elements. The method further involves depositing a pattern of electrical contacts over the first light emitting elements and the second light emitting elements. The electrical contacts are operable to separately activate the first light emitting elements and the second light emitting elements.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

Figure 1:
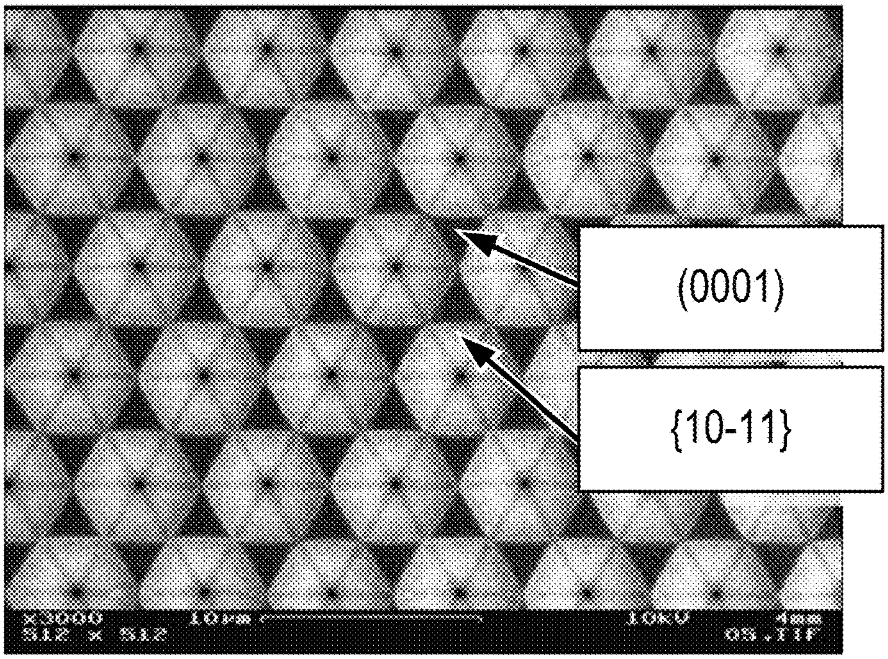
FIGS. 1 and 2 are electron microscope images of device structures according to example embodiments.

The present disclosure is generally related to manufacturing of electronic devices on crystalline wafers. For example, crystalline group III and nitrogen alloy (III-N) semiconductor material such as GaN and more generally AlGaInN can be used for creating a wide variety of solid state devices, such as transistors, diodes, light-emitting diodes (LEDs), lasers, etc. In some cases, the III-N material can be grown on a growth template or substrate such as sapphire, silicon, GaN, or AlN. Under the proper growth conditions, the III-N material can achieve epitaxial growth, in which the added material has a highly regular crystalline structure. When forming a device, subsequent layers are added with different material compositions (e.g., AlGaN, GaInN, AlInN, AlGaInN) to have the electrical and/or optical characteristics desired for the device.

This disclosure relates to the challenges of accomplishing multi-wavelength light-emitting diode (LED) emission from the same integrated chip and specifically for emissions at longer wavelength, e.g., in the red spectral regime ($\lambda$=620-750 nm) using the InGaN material system. Today, red LED (and laser) emission is often realized with the AlGaInP material systems that offers decent device performance. However, multiple applications can be enumerated where the AlGaInN material system would be much more preferred. For example, this includes applications for full color displays where all the sub-pixel emissions for RGB (red, green, blue) would all be based on the same materials platform (e.g., group III-nitride). This may be the case for applications where high display resolution and a small pixel form factor are desired, such as augmented and virtual reality (AR/VR) displays, mobile (phone) displays, etc., having all colors implemented on one platform.

Efficient emission from red InGaN quantum wells is considered a particularly hard undertaking. This is mainly due to challenges related to high quality semiconductor crystal growth for the high Indium-containing films. For example, a low growth temperature T is needed for high In-incorporation and the larger lattice mismatch between GaN and InGaN with Indium concentrations of >30% becomes problematic for high crystalline quality. In addition, intrinsic material properties in III-N related to internal polarization fields (e.g., piezo-electric polarization in quantum wells, quantum confined Stark effect) reduce the radiative efficiency of such structures. The proposed implementations address these issues via an epitaxial growth concept on a pre-structured surface exposing different III-N crystal facets with the prospects of achieving high material quality for high In-containing films.

In embodiments described herein, the active zone of the longer wavelength, e.g., red emitting LED pixels using the challenging InGaN quantum wells (QWs), would be grown onto a non-planar, particularly structured surface. This is different to conventional LED fabrication where the device heterostructure is typically grown on a smooth, un-structured wafer surface. The lateral definition of individual pixel elements in conventional micro- and mini-LED fabrication is typically done via etching after the semiconductor crystal growth is completed. As described below, the wafer topology for the proposed embodiments can be realized via selective area growth prior to the growth of the light emitting layers. Choosing the proper growth conditions and mask design for the selective area growth can result in the desired topology. Relevant growth parameters to influence the growth mode between lateral and vertical directions include growth temperature, reactor pressure, and the V-to-III ratio.

For the subsequent growth of the InGaN QWs, gas phase diffusion and incorporation efficiency of the indium species strongly depend on the exposed crystallographic surfaces. As seen in the scanning electron microscope images in FIGS. 1 and 2, the wafer surface could comprise an array of hexagonally shaped inverse pyramids featuring {10-11} GaN crystal facets and triangularly shaped (0001) c-plane areas in between the hexagons. Also, (0001) and {11-22} facets can be realized. Or if desired, a combination of (0001), {10-11}, and {11-22} planes can be used. Note that the triangular shape of the c-plane areas is a result of, among other things, the size and spacing of the initial three-dimensional growth structures (e.g., masking material). Other shapes and sizes are possible for these c-plane regions by choosing different initial growth patterns as well as regulating the height of the growth. As will be described in greater detail below, the difference in crystal orientation and their competition influences the thickness and indium content of the InGaN quantum wells, which both affect the emission wavelength.

Figure 2:
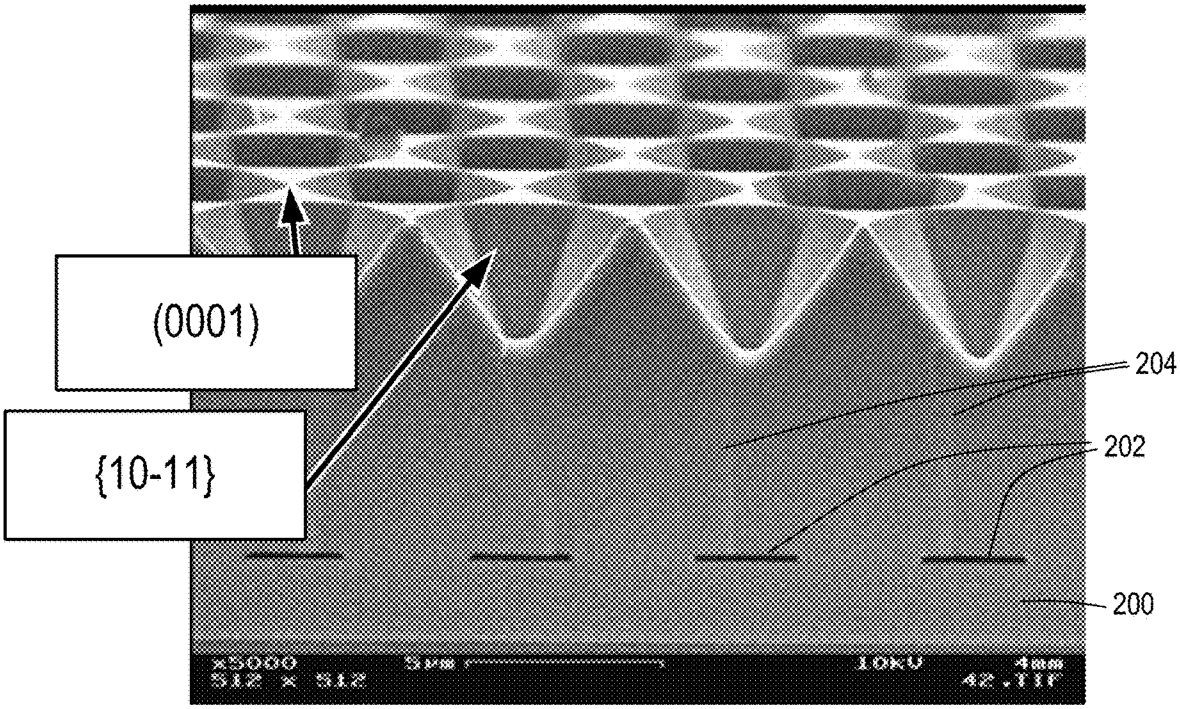

As seen in FIG. 2, a base layer 200 comprising GaN is provided, e.g., grown on a template or prepared from bulk wafer materials. A masking material is used to form shapes 202 on the base layer 200 for the subsequent selective area growth process. Additional epitaxial growth, e.g., using metal oxide vapor-phase epitaxy (MOVPE) after the shapes 202 are formed results in selectively grown structures in the areas not covered by the mask material. When the growth is continued the selectively grown structures might merge, forming a coalesced crystal with a non-planar topology. For example, this could result in the three-dimensional hexagonal structure shown. This selective area growth (SAG) process can result in epitaxially grown LED heterostructure on non-planar growth surfaces. Another benefit of the SAG process is the potential reduction of threading dislocations in the crystal, resulting in improved device performance and only minor dislocations 204. This structure can define a micro-LED pixel array without the need for etching the heterostructure. This bottom-up fabrication method can result in atomically smooth side walls with minimal defects in the crystalline structure, minimizing non-radiative recombination processes at the side walls.

Figure 3:
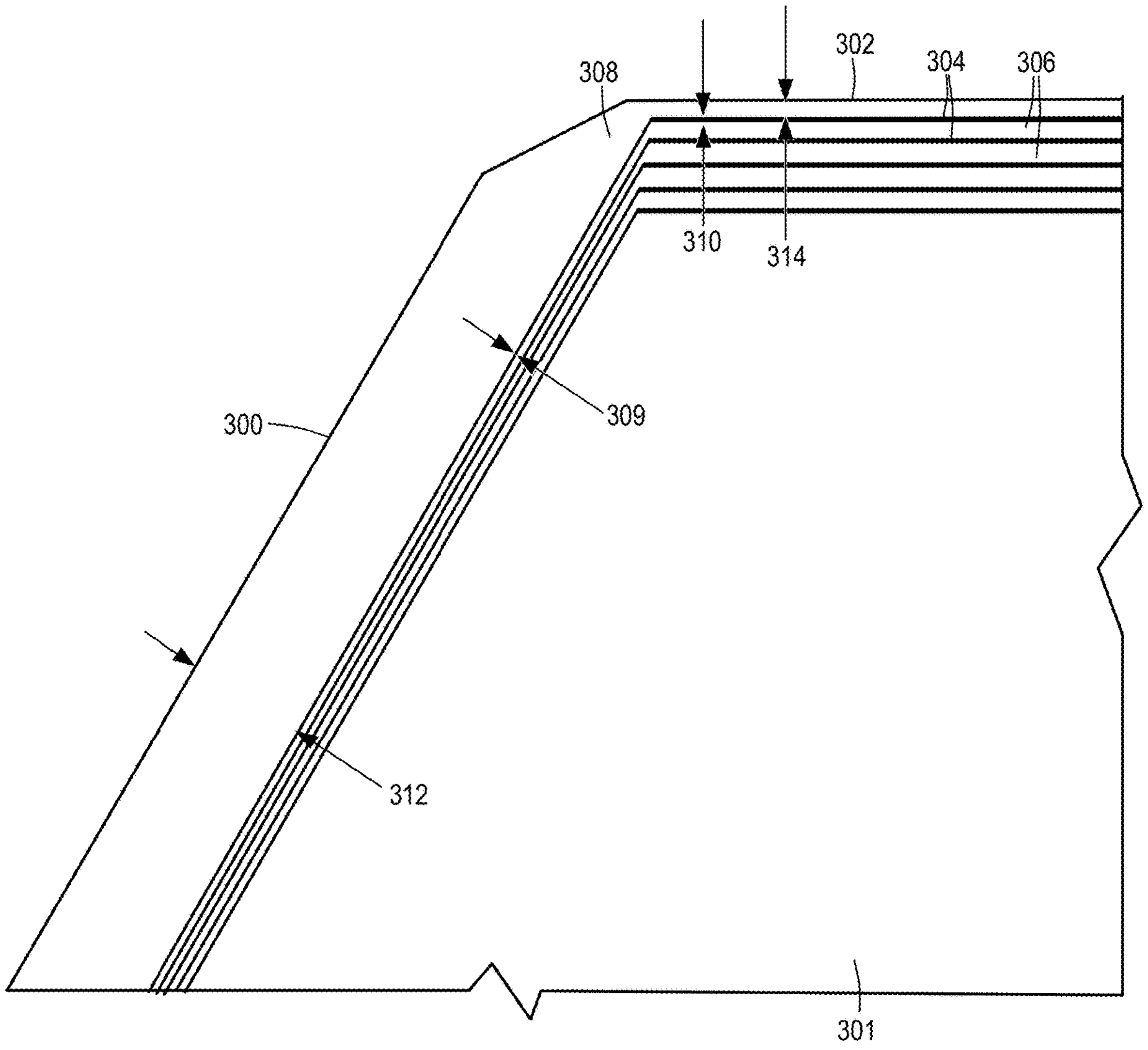
FIG. 3 is a cross-sectional view showing active device layers according to an example embodiment.

In FIG. 3, a diagram represents a cross section view of one of the structures shown in FIGS. 1 and 2, near an intersection between a {10-11) side facet 300 and (0001) top face 302. An n-type GaN base structure 301 is grown as described above to form inverted pyramids comprising {10-11} facets 300 and hexagonal bases. Layers 304, 306 are grown on the base structure 301. Layers 304 are GaInN QWs and layers 306 are (Al)Ga(In)N quantum barriers (QBs), separating the individual QWs. Optionally, an AlGaN-based electron blocking layer can be placed on top of the active zone consisting of QWs and QBs. A p-type doped GaN layer 308 (p-GaN) is grown on top of the structure to complete the p-n diode.

Note that the parts of the QW layers 304 parallel to the top surface 302 are thicker with a potentially higher In-content than those parts parallel to the sidewall 300. When a ternary compound such as InGaN is epitaxially grown on different surfaces such as these, various mechanisms occur and interplay. Gas phase diffusion and different incorporation probabilities for In and Ga can be expected for specific locations on the surfaces. It was found that thicker QWs 304 form on the (0001) c-plane areas versus the tilted {10-11} side facets when both are present. In addition, a higher growth rate leads to a higher In incorporation (at constant T) and the increased piezo-electric fields on the (0001) surface lead to longer emission wavelength (quantum-confined Stark effect). All of these factors result in an emission at longer wavelength (e.g., into the red part of the spectrum).

The pre-structured surface of devices built this way can be regarded as means for effectively strain-managing the highly compressively strained InGaN film (on GaN) as the material can partly relax laterally in-plane without disturbing the overall crystal quality. Furthermore, individual pixels or subpixels do not have to be structured via etching that typically induces many non-radiative recombination centers. Etching can degrade small-sized pixel elements as used in AR/VR displays.

Figure 4:
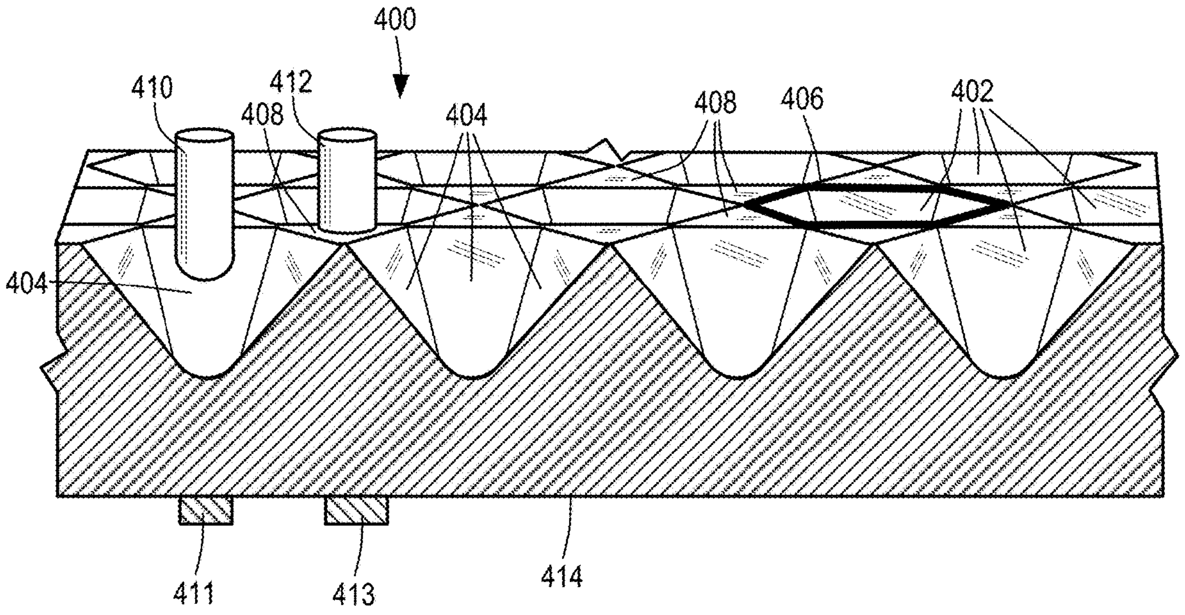
FIG. 4 is a perspective cutaway view showing details of a display according to an example embodiment.
Figure 5:
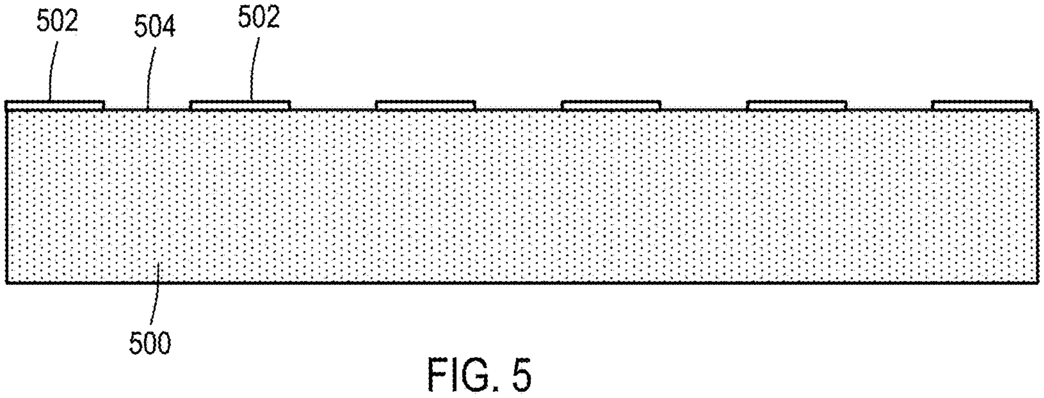
FIGS. 5-10 are side views showing process steps according to one or more embodiments.

In FIG. 4, a cross sectional view shows details of a light emitting diode (LED) display component 400 according to an example embodiment. The display component 400 includes an array of GaN inverted pyramids 402 epitaxially grown using a mask deposited on a GaN layer, e.g., see masked shapes 202 and base layer 200 in FIG. 2. The inverted pyramids comprise {10-11} and/or {11-22} facets 404 and hexagonal bases (indicated by highlighted corners 406). An array of c-plane surfaces 408 are parallel with the GaN substrate and formed by joining of the {10-11} or {11-22} facets 404 of adjacent ones of the GaN inverted pyramids.

As best seen in FIG. 3, an outer surface of the display component is covered by a quantum well layer 304 comprising a III-N compound formed on the {10-11} facets and the c-plane surfaces. The quantum well layer has a first thickness 309 on the {10-11} facets forming first light emitting elements. The quantum well layer 304 has a second thickness 310 on the c-plane surfaces forming second light emitting elements. The second thickness 310 is greater than the first thickness 309 such that the second light emitting elements emit light at a longer wavelength than the first light emitting elements. The p-GaN layer 308 has a third thickness 312 over the {10-11} facets and a fourth thickness 314 over the c-plane surfaces. The third thickness 312 is greater than the fourth thickness. The p-GaN layer 308 can be used for attaching a positive electrical contact used for passing current through the layers 304, 306.

A pattern of electrical contacts over the display component are operable to separately activate one of the first light emitting elements or the second light emitting elements. As seen in FIG. 4, a first contact 410 is over a first light emitting element on a {10-11} facet 404 and a second contact 412 is over a second light emitting element on a c-plane surface 408. These contacts 410, 412 would be p-contacts (anodes) for each pixel or sub-pixel and may be made of a transparent conductor such as indium tin oxide (ITO) or a reflective contact, such as Ag-based, for bottom emission of light from a bottom surface 414 of the substrate. Lower contacts 411, 413 could be formed on the bottom surface 414 of the device superimposed over one of the top contacts 410, 412. The lower contacts 411, 413 would serve as n-contacts (cathodes) and could be made of a reflective conductor or a transparent conductor for bottom emission. An array of these contacts 410-413 could be formed over the entire display and individually activated, e.g., via a matrix of wires and addressing circuitry on the top and/or bottom contacts. For simplicity, only one or a small number of n-contacts can be used in an alternative embodiment, e.g., a common n-type electrode would be used for all pixel elements and the individual addressing of the pixel or sub-pixel elements might happen only via the p-contacts. This is possible due to the highly conductive nature of n-type GaN that allows sufficient current spreading over an extended distance. In the case of a common n-electrode, the n-contact can also be formed on the Ga-face of the crystal, i.e., on the same side as the p-contacts, via removing (e.g., dry etching) of the p-layers and the active zone.

In FIGS. 5-9, diagrams illustrate a method according to an example embodiment. The method involves providing a GaN substrate 500. The substrate 500 which may be epitaxially formed on a growth template or the substrate 500 may be part of a bulk GaN wafer. An array of closed shapes of a mask material 502 (e.g., a dielectric such as SiO2 or SiN) are patterned on a top plane 504 of the GaN substrate 500. The closed shapes of the mask material 502 may include any shape, e.g., rectangles, circles, triangles. Generally, the GaN may grow to a geometry (e.g., upward and inverted pyramids) dictated by the crystalline structure of the GaN and growth parameters (e.g., temperature, pressure, V-to-III ratio) regardless of the shape of the mask material 502. The arrangement of the mask material shapes (e.g., rectangular grid, offset rows corresponding to a honeycomb pattern) can influence the final shape of the device.

Figure 6:
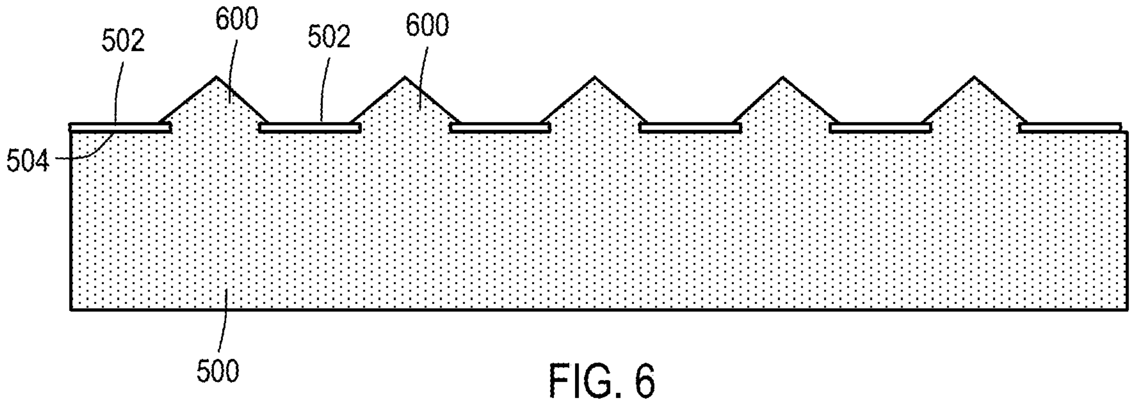
Figure 7:
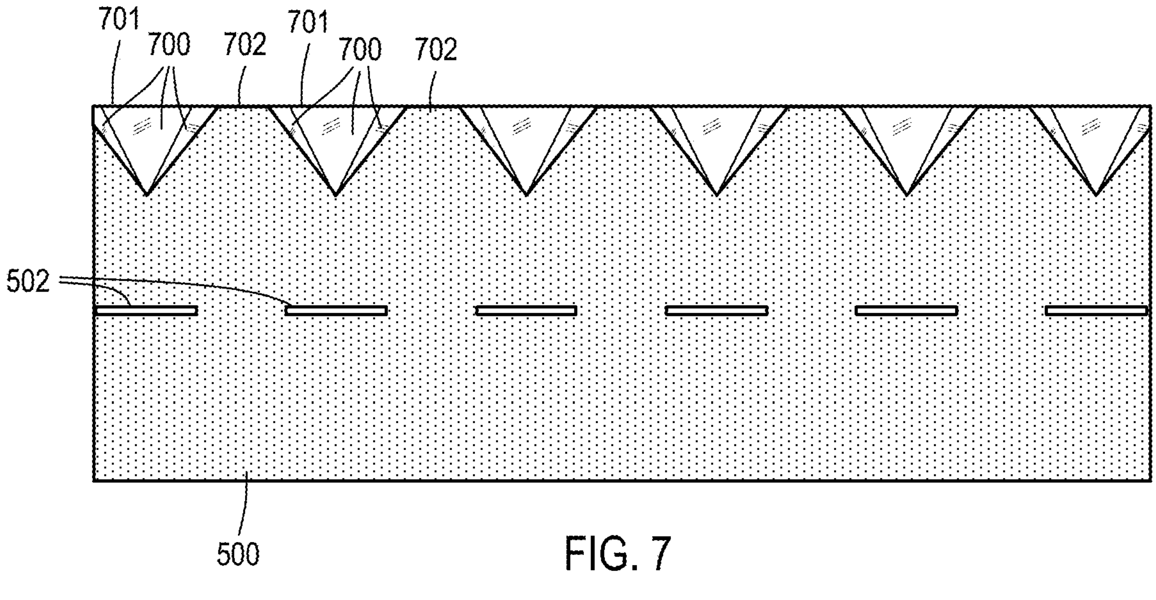

As seen in FIG. 6, GaN structures 600 are selectively and epitaxially grown around the array of closed shapes of mask material 502. The structures 600 extend above the mask material 502 and ultimately grow to cover the mask material. As seen in FIG. 7, the structures 600 form an array of GaN inverted pyramids 701 and an array of GaN c-plane surfaces 702. The inverted pyramids include {10-11} or {11-22} facets 700 and hexagonal bases. The GaN c-plane surfaces 702 are parallel with the GaN substrate 500 and join the {10-11} or {11-22} facets 700 of adjacent ones of the GaN inverted pyramids 701.

Figure 8:
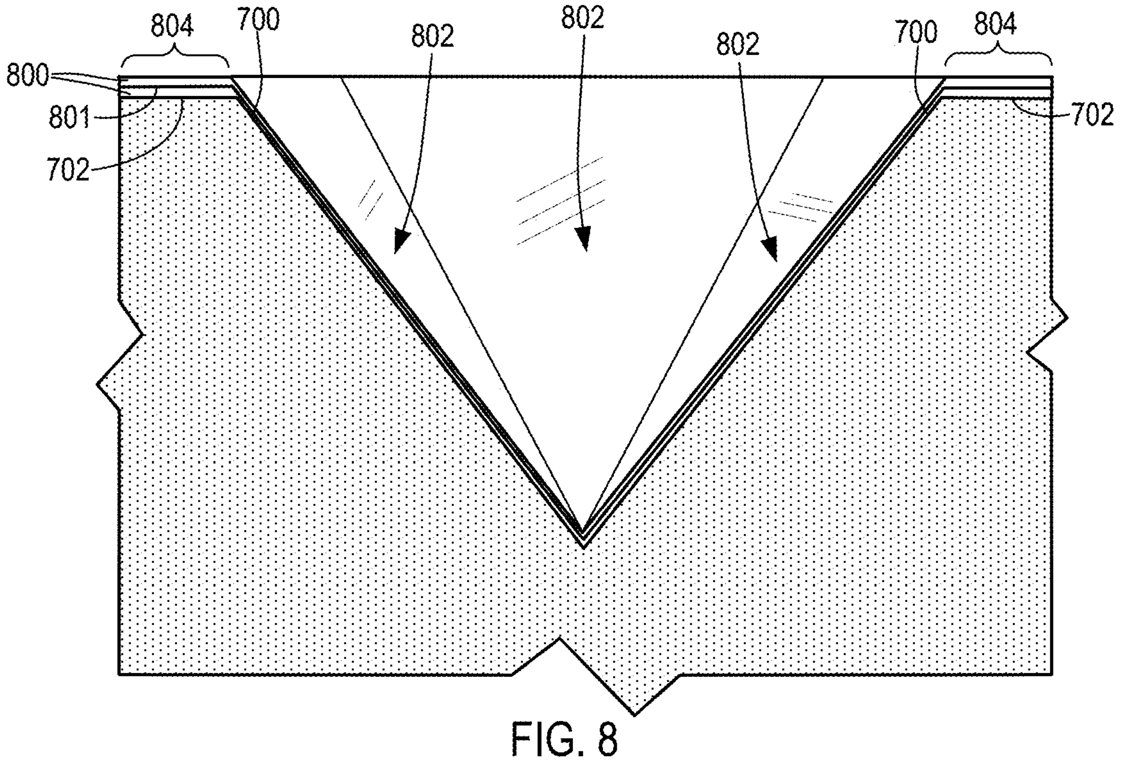

As seen in FIG. 8, a quantum well layer 801 surrounded by quantum barrier 800 (two layers in this example) are epitaxially grown. The quantum well layer 801 comprising a III-N compound on the {10-11} facets and the c-plane surfaces. The quantum well layer 801 has a first thickness on the {10-11} facets 700 forming first light emitting elements 802. The quantum well layer 801 has a second thickness on the c-plane surfaces 702 forming second light emitting elements 804. The second thickness is greater than the first thickness such that the second light emitting elements 804 emit light at a longer wavelength than the first light emitting elements 802. The increased QW thickness, a potentially higher In content in the GaInN QW and the increased piezoelectric field all lead to the longer emission wavelength in the second light emitting elements 804.

Figure 9:
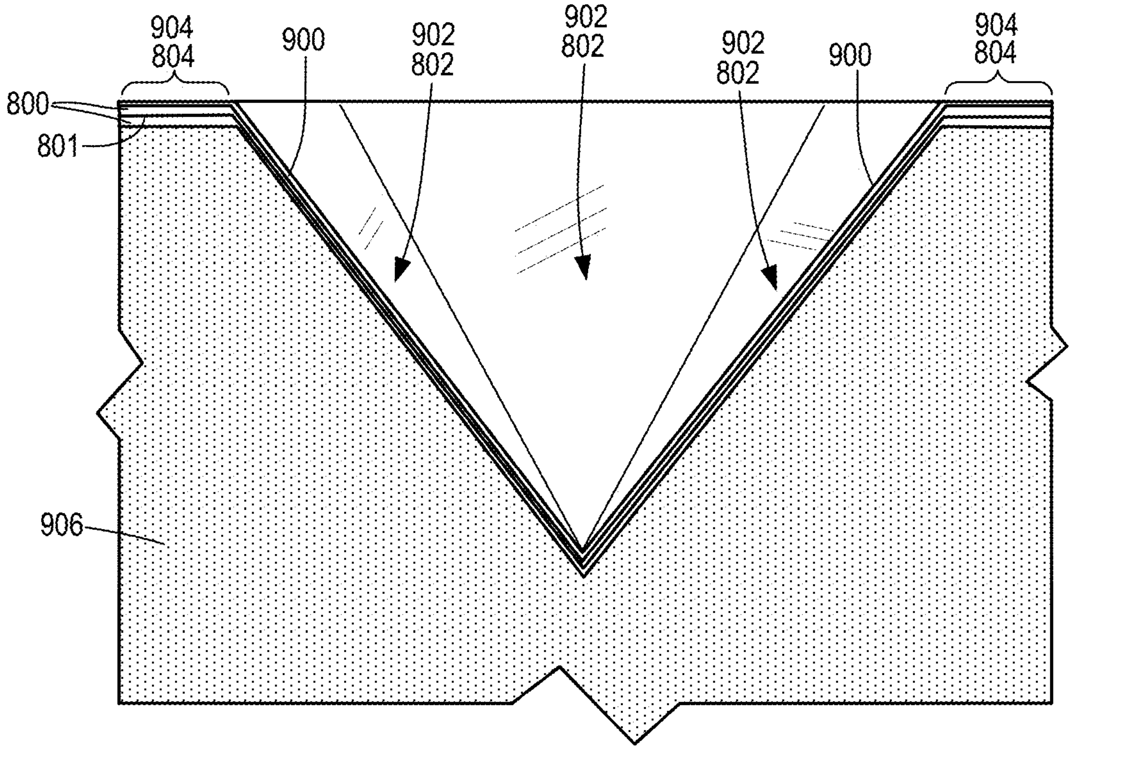
Figure 10:
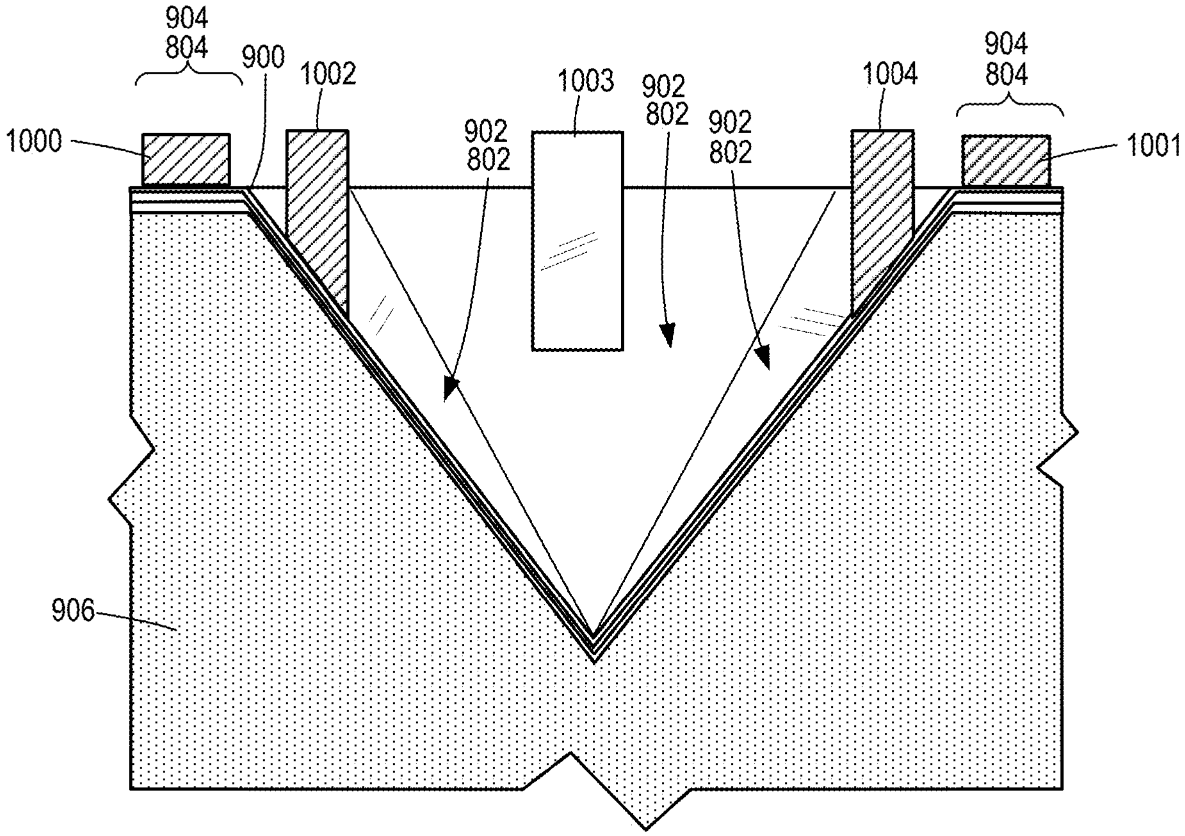

As seen in FIG. 9, a top layer 900, e.g., a p-type III-N compound, is grown over the layers 800, 802. The top layer 900 forms, together with the first and second light emitting elements 802, 804, first and second pixels or subpixels 902, 904. The first and second pixels/subpixels 902, 904 can be illuminated by applying a current through the quantum well layer 801 via the n-type based layer 906 and p-type top layer 900. As seen in FIG. 10, a pattern of electrical contacts 1000-1004 are formed (e.g., deposited) over at least one of the first and second pixels or subpixels 902, 904. The electrical contacts 1000-1004 are operable to separately activate at least one of the first light emitting elements or the second light emitting elements 802, 804. Note that a separate electrical contact 1002, 1003, 1004 is shown on each facet that forms a first pixel/subpixel 902, however other combinations are possible, e.g., one electrical contact that covers two or more facets of the inverted pyramid. Similarly, a single contact could cover two different second pixel/subpixels 904. In any case, the contact shown in the diagram is only for illustrational purposes. The p-type contact may cover the entire semipolar surfaces of an inverted pyramid or just a portion of it as shown in the figures. The contact might include a transparent, electrically conductive material (e.g., ITO) or might contain reflective elements (e.g., Ag).

In some embodiments, the second pixel/subpixels 904 will emit red, and the first pixel/subpixels 902 will emit blue and/or green. In some embodiments, the second pixel/subpixels 904 will emit green, and the first pixel/subpixels 902 will emit blue. In some embodiments, the first pixel/subpixels 902 can naturally emit blue over the entire structure. For some portion of the first pixel/subpixels 902, phosphors or quantum dot materials can be overlaid onto this portion to down-convert the blue light to green or red.

In the above embodiments, there are numerous mask designs possible for the initial three-dimensional GaN growth, some of which have been described above. However, a regular and homogeneous mask design might be preferred for devices such as micro LED displays. Growth conditions can be varied (e.g., T, V-to-III-ratio, pressure) to alter growth rates in the different crystallographic directions and, thus, have additional crystal facets exposed other than the ones enumerated in the implementations described above. Further, spacings of the mask material as well as build height of the three-dimensional structures can increase the surface areas of the c-plane regions, thus increasing a relative amount of red light emitted relative to other wavelengths emitted by the inverted pyramid facets.

Red (electro-)luminescence can also be achieved with AlGaInP materials. However, in the case of display applications the integration of dissimilar materials becomes particularly challenging (e.g., AlGaInP for red, AlGaInN for blue and green). Longer wavelength (red) emission can also be achieved through optical down-conversion (e.g., phosphors or quantum dot materials are optically pumped by blue light and emit red). Theoretically, conventional InGaN QWs on a planar growth surface could lead to the desired emission. However, conventional approaches typically result in poor device performance.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The terms "coupled" or "connected" refer to elements being attached to each other either directly (in direct contact with each other) or indirectly (having one or more elements between and attaching the two elements). Either term may be modified by "operatively" and "operably," which may be used interchangeably, to describe that the coupling or connection is configured to allow the components to interact to carry out at least some functionality.

Terms related to orientation, such as "top," "bottom," "side," and "end," are used to describe relative positions of components (e.g., as arranged in the figures) and are not meant to limit the orientation of the embodiments contemplated. For example, an embodiment described as having a "top" and "bottom" also encompasses embodiments thereof rotated in various directions unless the content clearly dictates otherwise.

Reference to "one embodiment," "an embodiment," "certain embodiments," or "some embodiments," etc., means that a particular feature, configuration, composition, or characteristic described in connection with the embodiment is included in at least one embodiment of the disclosure. Thus, the appearances of such phrases in various places throughout are not necessarily referring to the same embodiment of the disclosure. Furthermore, the particular features, configurations, compositions, or characteristics may be combined in any suitable manner in one or more embodiment.

References to a "combination" of different elements is also meant to include each element on its own unless otherwise indicated. For example, a combination of A, B, and C may include any one of A, B, or C alone, as well as A+B, A+C, A+B+C, etc. Further, where the elements of the combinations are actions (e.g., steps of a method), the listing of actions is not meant to imply a specific order that the actions may be taken in the combination unless otherwise indicated.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination and are not meant to be limiting, but purely illustrative. It is intended that the scope of the invention be limited not with this detailed description, but rather determined by the claims appended hereto.

The invention claimed is:

1. A light emitting diode array comprising:

a growth mask comprising an array of closed shapes on a III-N layer, the III-N layer epitaxially grown on a substrate;

an array of group III-N inverted pyramids epitaxially grown around the growth mask, the inverted pyramids comprising {10-11} or {11-22} facets and hexagonal bases;

an array of III-N c-plane surfaces parallel with the substrate joining the {10-11} or {11-22} facets of adjacent ones of the III-N inverted pyramids;

a quantum well layer comprising a III-N compound formed on the {10-11} or {11-22} facets and the c-plane surfaces, the quantum well layer having a first thickness on the {10-11} or {11-22} facets forming first light emitting elements, the quantum well layer having a second thickness on the c-plane surfaces forming second light emitting elements, the second thickness greater than the first thickness such that the second light emitting elements emit light at a longer wavelength than the first light emitting elements; and a pattern of electrical contacts over the light emitting array that are operable to separately activate the first light emitting elements and the second light emitting elements.

2. The light emitting diode array of claim 1, wherein the longer wavelength comprises a green wavelength.

3. The light emitting diode array of claim 1, wherein the longer wavelength comprises a red wavelength.

4. The light emitting diode array of claim 1, wherein the III-N compound comprises GaInN.

5. The light emitting diode array of claim 4, wherein a concentration of In in the GaInN is greater on the c-plane surfaces than on the {10-11} or {11-22} facets.

6. The light emitting diode array of claim 4, further comprising a p-GaN material layer covering the quantum well layer, the p-GaN material layer having a third thickness over the {10-11} or {11-22} facets and a fourth thickness over the c-plane surfaces, the third thickness greater than the fourth thickness, a subset of the electrical contacts coupled to the p-GaN material layer.

7. The light emitting diode array of claim 1, wherein the c-plane surfaces are triangularly shaped.

8. The light emitting diode array of claim 1, wherein a portion of the inverted pyramids are covered by phosphors or quantum dot materials to down-convert the light emitted from the portion of the inverted pyramids.

9. The light emitting diode array of claim 1, wherein the inverted pyramids comprise {10-11} facets.

10. The light emitting diode array of claim 1, wherein the pattern of electrical contacts over the light emitting array comprise positive contacts on the {10-11} or {11-22} facets and the c-plane surfaces and negative contacts on a bottom surface of the substrate facing away from the {10-11} or {11-22} facets and the c-plane surfaces.

11. The light emitting diode array of claim 10, wherein the light emitting diode array emits light from the {10-11} or {11-22} facets and the c-plane surfaces, and wherein the positive contacts are made from a transparent conductor.

12. The light emitting diode array of claim 10, wherein the light emitting diode array emits light from the bottom surface of the substrate, and wherein the positive contacts are made from a reflective conductor.

13. The light emitting diode array of claim 1, wherein the growth mask comprises a dielectric material.

14. The light emitting diode array of claim 1, wherein the substrate comprises sapphire, silicon, GaN, or AlN.

15. A display comprising the light emitting diode array of claim 1.

16. The display of claim 15, wherein the {10-11} or {11-22} facets and the c-plane surfaces comprise subpixels of the display.

* * * * *